US009541243B2

(12) United States Patent
Hikmet et al.

(10) Patent No.: US 9,541,243 B2
(45) Date of Patent: Jan. 10, 2017

(54) LIGHT CONVERSION ASSEMBLY, A LAMP AND A LUMINAIRE

(71) Applicant: KONINKLIJKE PHILIPS N.V., Eindhoven (NL)

(72) Inventors: Rifat Ata Mustafa Hikmet, Eindhoven (NL); Ties Van Bommel, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/194,864

(22) Filed: Jun. 28, 2016

(65) Prior Publication Data

US 2016/0312966 A1 Oct. 27, 2016

Related U.S. Application Data

(63) Continuation of application No. 14/391,737, filed as application No. PCT/IB2013/052820 on Apr. 9, 2013, now Pat. No. 9,404,627.

(Continued)

(51) Int. Cl.
*F21V 9/00* (2015.01)
*F21V 9/16* (2006.01)

(52) U.S. Cl.
CPC . *F21K 9/64* (2016.08); *F21K 9/62* (2016.08); *F21V 9/16* (2013.01); *F21Y 2115/10* (2016.08); *F21Y 2115/30* (2016.08)

(58) Field of Classification Search
CPC ............. F21K 9/62–9/66; F21Y 2101/00; F21Y 2101/30; H01J 61/44; H01L 33/504
See application file for complete search history.

(56) References Cited

U.S. PATENT DOCUMENTS 6,501,091 B1 12/2002 Bawendi et al.
7,600,882 B1 * 10/2009 Morejon .................. F21V 3/00
362/231

(Continued)

FOREIGN PATENT DOCUMENTS

CN 1755958 A 4/2006
JP 2006032726 A 2/2006

(Continued)

OTHER PUBLICATIONS

EPO as ISA, PCT/IB2013/052820, filed Apr. 9, 2013, "International Search Report and Written Opinion", mailed Sep. 6, 2013, 10 pages.

(Continued)

*Primary Examiner* — Ali Alavi

(57) ABSTRACT

A light conversion assembly, a lamp and a luminaire is provided. The light conversion assembly comprises a first layer and a second layer. The first layer comprises first luminescent material. The first luminescent material comprises particles showing quantum confinement and have at least in one dimension a size in the nanometer range. The first layer is arranged to receive light from a light source emitting light of a first spectral distribution in a violet or blue spectral range. The first spectral distribution has a first peak wavelength. The first layer is configured to convert substantially all the received light towards light of a second spectral distribution in the blue spectral range, independently of the position of first spectral distribution in the violet or blue spectral range. The second spectral distribution has a second peak wavelength which is a longer wavelength than the first peak wavelength. The second layer comprises a second luminescent material. The second layer is arranged to receive light of the second spectral distribution and is configured to at least partially convert the received light towards light of a third spectral distribution being different (Continued)

from the first spectral distribution and the second spectral distribution.

19 Claims, 5 Drawing Sheets

Related U.S. Application Data

(60) Provisional application No. 61/623,609, filed on Apr. 13, 2012.

(56) References Cited

U.S. PATENT DOCUMENTS

| | | |
|---|---|---|
| 7,804,103 B1 | 9/2010 | Zhai et al. |
| 2006/0066210 A1 | 3/2006 | Ng et al. |
| 2006/0113895 A1 | 6/2006 | Baroky et al. |
| 2006/0244358 A1 | 11/2006 | Kim et al. |
| 2008/0203414 A1 | 8/2008 | Yen et al. |
| 2009/0294742 A1 | 12/2009 | Jang et al. |
| 2010/0019261 A1 | 1/2010 | Scianna et al. |
| 2010/0140605 A1 | 6/2010 | Shibata et al. |
| 2010/0289044 A1 | 11/2010 | Krames et al. |
| 2011/0089453 A1* | 4/2011 | Min .................. H01L 33/60 257/98 |
| 2011/0240960 A1 | 10/2011 | Kim et al. |
| 2011/0273079 A1 | 11/2011 | Pickard et al. |
| 2012/0001204 A1 | 1/2012 | Jagt |
| 2012/0248479 A1 | 10/2012 | Anc |
| 2013/0215599 A1 | 8/2013 | Davis et al. |
| 2014/0097742 A1* | 4/2014 | Van Bimmel ........ H05B 33/145 313/483 |
| 2014/0206117 A1 | 7/2014 | Sonoda et al. |
| 2014/0355242 A1 | 12/2014 | Van Stun et al. |
| 2015/0054401 A1 | 2/2015 | Van Bommel et al. |
| 2015/0300577 A1 | 10/2015 | Van Bommel et al. |

FOREIGN PATENT DOCUMENTS

| | | |
|---|---|---|
| WO | WO-2010106478 A1 | 9/2010 |
| WO | WO-2011117791 A1 | 9/2011 |

OTHER PUBLICATIONS

First Office Action dated Jul. 5, 2016, China Application No. 2013800196415 filed Apr. 9, 2013, 9 pages.

\* cited by examiner

LIGHT CONVERSION ASSEMBLY, A LAMP AND A LUMINAIRE

CROSS-REFERENCE TO RELATED APPLICATIONS

The present application is a continuation of U.S. patent application Ser. No. 14/391,737 filed on Oct. 10, 2014, titled "LIGHT CONVERSION ASSEMBLY, A LAMP AND A LUMINAIRE", which is a §371 application of International Application No. PCT/IB2013/052820 filed on Apr. 9, 2013, which claims priority to U.S. Provisional Patent Application No. 61/623,609 filed on Apr. 13, 2012. U.S. patent application Ser. No. 14/391,737, International Application No. PCT/IB2013/052820, and U.S. Provisional Patent Application No. 61/623,609 are incorporated herein.

FIELD OF THE INVENTION

The invention relates to light conversion assemblies for converting light emitted by a light source towards light of a different color.

BACKGROUND OF THE INVENTION

In several applications a Light Emitting Diode (LED) that emits blue light is combined with luminescent material which converts a part of the blue light towards light of another color, for example, to yellow, orange or red light. Often not all blue light is converted to the another color, because white light must be emitted by an assembly of the LED and the luminescent material. The amount and characteristics of the luminescent material is chosen such that a required amount of blue light is converted towards a specific amount the another color such that the combined emission of remaining blue light and the specific amount of the light of the another color combines to white light, which means, to a light with a color point which is close to the black body line in a color space.

Published patent application US2012/0001204 discloses a color adjusting arrangement wherein light emitters are combined with layers of luminescent materials to obtain a light emission of a specific color.

However, during production of lighting assemblies that use a combination of a blue light source and a layer of luminescent material which partially converts the blue light to light of another color a problem arises. It is relatively difficult to manufacture light emitters, for example LEDs, which all emit exactly the same blue light emission spectrum. It is not acceptable to combine light emitters, which slightly deviate from each other, with only one type of a layer with one specific amount of luminescent material, because it would result in lighting assemblies that emit slightly different colors of light. The emission of slightly different colors of light is well detectable by the human naked eye and may lead, for example, to luminaires with different light sources each emitting slightly different colors of light. A known solution is: after manufacturing the blue light emitting light emitters, each blue light emitter is characterized and binned and is combined with a layer with luminescent material of a certain thickness related to the characteristics of the specific blue light emitter in order to obtain a light emission that has the desired color point. Characterizing and binning the manufactured light emitters is relatively expensive, and a relatively large amount of different layers with luminescent material need to be kept in stock which is also relatively expensive.

SUMMARY OF THE INVENTION

It is an object of the invention to provide a color conversion assembly which allows the use of blue light emitting light sources which have slightly different blue light emission spectra.

A first aspect of the invention provides a light conversion assembly. A second aspect of the invention provides a lamp. A third aspect of the invention provides a luminaire. Advantageous embodiments are defined in the dependent claims.

A light conversion assembly in accordance with the first aspect of the invention comprises a first layer and a second layer. The first layer comprises first luminescent material. The first luminescent material comprises particles showing quantum confinement and have at least in one dimension a size in the nanometer range. The first layer is arranged to receive light from a light source emitting light of a first spectral distribution in a violet or blue spectral range. The first spectral distribution has a first peak wavelength. The first layer is configured to convert substantially all the received light towards light of a second spectral distribution in the blue spectral range, independently of the position of first spectral distribution in the violet or blue spectral range. The second spectral distribution has a second peak wavelength which is a longer wavelength than the first peak wavelength. The second layer comprises a second luminescent material. The second layer is arranged to receive light of the second spectral distribution and is configured to at least partially convert the received light towards light of a third spectral distribution being different from the first spectral distribution and the second spectral distribution.

The first layer, which comprises the first luminescent material, converts substantially all the light of the first spectral distribution to light of the second spectral distribution. This is done independently of the exact position of the first spectral distribution in the blue or violet spectral range. This implies that the absorption spectrum of the first luminescent material is relatively wide and overlaps with the possible locations of the first spectral distribution in the violet and blue spectral range. It further implies that the amount of the first luminescent materials in the first layer is relatively large—at least large enough to absorb all received light of the first spectral distribution to obtain, for example, full conversion. The first luminescent material shows quantum confinement, which means that the particles have optical properties that depend on the size of the particles. Examples of such materials hare quantum dots, quantum rods and quantum tetrapods. The first luminescent material is a luminescent material that has a well-defined light emission spectrum, and as such, the position of the second spectral distribution within the blue spectral range is well-defined, as well as the second peak wavelength is. Thus, the first layer which comprises the first luminescent material converts light of which it is not exactly known where its spectral distribution is located in the violet or blue spectral range to blue light of which it is well known at which wavelengths its spectral distribution and peak wavelength is located.

Subsequently, at least a portion of the light of the second spectral distribution is converted towards light of the third spectral distribution. The non-converted portion of the light of the second spectral distribution is emitted into the ambient together with the generated light of the third color distribution. As the position of the second color distribution is well known, and the absorbed portion is well known, and the amount of generated light of the third spectral distribution is well known, the total light emission of the light conversion assembly is well defined and well known. No characterization or binning of light sources which emit the light of the first spectral distribution is required, and no different second layers must be kept in stock. Especially, the first layer with the first luminescent material contributes to this effect because it after the full conversion of the color of the light by the first layer the position of the second spectral distribution is not subject to tolerances which may result in visible color differences.

A further benefit of the light conversion assembly is that the first layer with the first luminescent material converts the violet or blue light to blue light of a higher wavelengths (of the second spectral distribution). The human eye is less sensitive to light with a wavelength in the violet and lower blue spectral ranges. If the wavelength of the light is increased to a wavelength in the higher blue spectral range, the human eye experiences the light as light of a higher intensity. Thus, the human eye experiences the converted light as light of a higher amount of lumen. A portion of this light of more lumen is not converted by the second layer, and, thus, is the total light emission of the light conversion assembly experienced as light of a higher intensity, while, at the same moment, the amount of received light of the first spectral distribution expressed in (optical) watts is not increased.

Optionally the first layer is configured to fully convert the received light from the light source emitting light of a first spectral distribution in a violet or blue spectral range towards light of a second spectral distribution in the blue spectral range. It is to be noted that full conversion of light means that there is no remaining light of the first spectral distribution in the light emission of the color conversion assembly. Thus, all light which is received by the first layer is converted to light of another color. However, during the conversion some losses may result in a slightly less emitted light of the second spectral distribution, but, in the context of full conversion, the most important characteristic is that there is no remaining light of the first spectral distribution. A partial conversion of light of the second spectral distribution towards light of the third spectral distribution means that not all light is converted and that a portion of the light of the second spectral distribution is emitted by the light conversion assembly.

The particles of the first luminescent material have in at least one dimension a size which in the nanometer range. This means, for example, that, if the particles are substantially spherical, their diameter is in the nanometer range. Or, this means, for example, if they are wire-shaped, that a size of a cross-section of the wire is in one direction in the nanometer range. A size in the nanometer range means that their size is at least smaller than 1 micrometer, thus, smaller than 1000 nanometer, and larger or equal to 0.5 nanometer. In an embodiment, the size in one dimension is smaller than 50 nanometer. In another embodiment the size in one dimension is in the range from 2 to 30 nanometer.

Optionally, the light conversion assembly comprises the light source for emitting light of the first spectral distribution in the violet or the blue spectral range.

Optionally, an absorption spectrum of the first luminescent material fully overlaps with the first spectral distribution. If the absorption spectrum fully overlaps with the first spectral distribution potentially all light of the first spectral distribution is converted towards light of the second spectral distribution.

Optionally, the first layer comprises an amount of quantum dots large enough to fully absorb the received light. If all received light of the first spectral distribution is absorbed, all light is going to be converted by the first luminescent material and no light of the first spectral distribution remains in the light emission spectrum of the light conversion assembly. The efficiency of the conversion of the first luminescent material may result in some losses such that the total amount of energy of the received light of the first spectral distribution is slightly higher than the total amount generated light of the second spectral distribution.

Optionally, the second peak wavelength is in a range from 460 nanometer to 480 nanometer. If the peak wavelength of the second spectral distribution is in this range, the peak wavelength is a relatively long wavelength in the blue spectral range, which means that the naked human eye experiences the light of the second spectral distribution much more intensive than the light of the first spectral distribution which has a lower peak wavelength. Thus, the total light emission of the color conversion assembly is experienced more intense than one would expect on basis of the received light of the first spectral distribution.

Optionally, the first peak wavelength is in a range from 380 nanometer to 460 nanometer. Optionally, the first peak wavelength is in a range from 440 nanometers to 460 nanometers. If the first peak wavelength is in one of these ranges, still enough non-used wavelengths in the blue spectral range is available in which the light of the second spectral distribution may be emitted. Thus, a designer of the light conversion assembly is able to select the first luminescent material which has a light emission spectrum in the part of the blue spectral range which does not overlap with the first spectral distribution and which has a light absorption spectrum which fully overlaps with possible location of the first spectral distribution. Furthermore, such a position in the violet or blue spectral range allows a relatively large increase of peak wavelength from the first peak wavelength to the second peak wavelength, and, thus, a significant increase of the converted light when being expressed in lumen.

Optionally, the third spectral distribution falls within a spectrum from 500 nanometer to 800 nanometer.

Optionally, the first layer is in direct contact with the light source. If the first layer is in direct contact with the light source it is easier to obtain a full conversion of light of the first spectral distribution. This optional embodiment prevents the leakage of light in between the light source and the first layer. Furthermore, the size of the first layer may be kept relatively small which saves materials.

Optionally, a gap is present between the first layer and the second layer. In other words, the second layer is arranged in a remote or vicinity configuration which means that the second layer is not in direct contact with the first layer. The gap prevents that the second layer receives heat from the first layer (and vice versa) as the result of conduction of heat. It is often advantageous to prevent that the second luminescent material in the second layer becomes too hot, because this may damage the second luminescent material and influence the efficiency of the second luminescent material in a negative way. Furthermore, in specific vicinity configurations, the total efficiency of the light conversion assembly may be higher.

Optionally, the light conversion assembly further comprises a reflective light mixing chamber. At least one of the light source, the first layer, the second layer are arranged within the reflective light mixing chamber. Optionally, the reflective light mixing chamber comprises a light exit window and the second layer is arranged at the light exit window.

Walls of the reflective light mixing chamber reflect light which impinges on them and, thus, recycles light which is emitted or reflected by one of the components of the light conversion assembly in a wrong direction (which is not the direction of the light exit window). The light source may emit light towards the walls and the first layer or second layer may reflect a portion of the light which impinges on them. The efficiency of the light conversion assembly as a whole increases. Further, depending on the exact arrangement of the at least one of the light source, the first layer, the second layer within the reflective light mixing chamber, the light is better mixed and/or distributed such that a more homogeneous light output is obtained from the light conversion assembly.

Optionally, the first luminescent material comprises at least one of quantum dots, quantum rods and quantum tetrapods. Such materials have optical properties which depend on their size and in one direction their size is in the nanometer range. Thus, they are suitable materials for the first luminescent material.

According to the second aspect of the invention, a lamp is provided which comprises a light conversion assembly according to the first aspect of the invention.

According to the third aspect of the invention, a luminaire is provided which comprises a light conversion assembly according to the first aspect of the invention or which comprises a lamp according to the second aspect of the invention.

The lamp according to the second aspect of the invention and the luminaire according to the third aspect of the invention provide the same benefits as the light conversion assembly according to the first aspect of the invention and have similar embodiments with similar effects as the corresponding embodiments of the light conversion assembly.

According to the fourth aspect of the invention, the use of a layer comprising a first luminescent material in a light conversion assembly is provided. The use is for fully converting light of a first spectral distribution towards light of a second spectral distribution, the first spectral distribution is within the violet or blue spectral range and has a first peak wavelength. The second spectral distribution is within the blue spectral range and has a second peak wavelength. The second peak wavelength is a longer wavelength than the first peak wavelength. The full conversion is independently of the position of the first spectral distribution in the violet or blue spectral range. The first luminescent material comprising particles showing quantum confinement and having at least in one dimension a size in the nanometer range.

The term "substantially" herein, such as in "substantially all emission" or in "substantially consists", will be understood by the person skilled in the art. The term "substantially" may also include embodiments with "entirely", "completely", "all", "fully" etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of".

These and other aspects of the invention are apparent from and will be elucidated with reference to the embodiments described hereinafter.

It will be appreciated by those skilled in the art that two or more of the above-mentioned options, implementations, and/or aspects of the invention may be combined in any way deemed useful.

Modifications and variations of the system or the assembly, which correspond to the described modifications and variations of the assembly, can be carried out by a person skilled in the art on the basis of the present description.

Figure 1A:
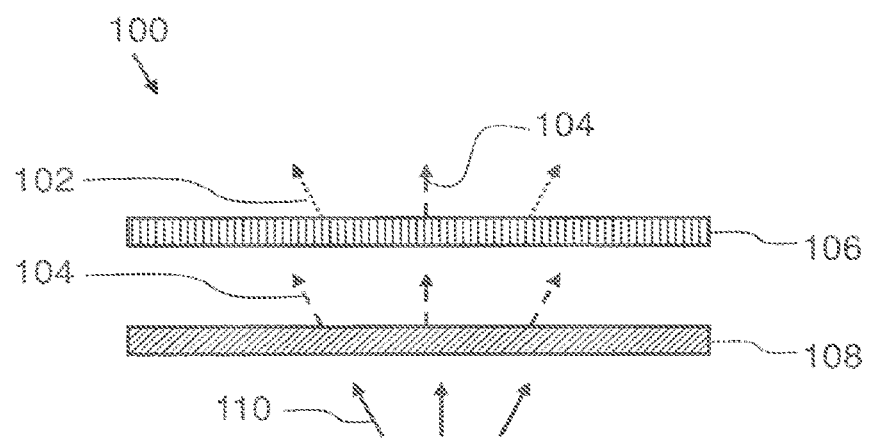
FIG. 1a schematically shows a cross-sectional view of a first embodiment of a light conversion assembly according to the first aspect of the invention, FIG. 1b schematically shows a chart with light emission spectra and light absorption spectra of the light source and first layer of the light conversion assembly, FIG. 2a schematically shows another embodiment of the light conversion assembly, FIG. 2b schematically shows a further embodiment of the light conversion assembly, FIG. 3 schematically shows alternative arrangements of the components of the light conversion assembly, FIGS. 4a and 4b schematically show embodiments of a lamp according to the second aspect of the invention, and FIG. 5 schematically shows an embodiment of a luminaire according to the third aspect of the invention.

It should be noted that items denoted by the same reference numerals in different Figures have the same structural features and the same functions, or are the same signals. Where the function and/or structure of such an item have been explained, there is no necessity for repeated explanation thereof in the detailed description.

The Figures are purely diagrammatic and not drawn to scale. Particularly for clarity, some dimensions are exaggerated strongly.

DETAILED DESCRIPTION

A first embodiment is shown in FIG. 1. FIG. 1a schematically shows a cross-sectional view of a light conversion assembly 100 according to the first aspect of the invention. A first layer 108 of the light conversion assembly 100 receives light 110 of a first spectral distribution. The first spectral distribution is in a violet or blue spectral range and the first spectral distribution has a first peak wavelength in the violet or blue spectral range. The first layer 108 comprises quantum dots which is a luminescent material. The quantum dots absorb light of the first spectral distribution and convert the absorbed light towards light 104 of a second spectral distribution. The second spectral distribution is in the blue spectral range and has a second peak wavelength which is a longer wavelength than the first peak wavelength. The first layer 108 is configured to fully convert the received light of the first spectral distribution towards light 104 of the second spectral distribution. The full conversion is independently of the exact position of the first spectral distribution in the violet or the blue spectral range. Thus, the light emitted by the first layer is light 104 of the second spectral distribution and the light conversion assembly further comprises a second layer 106 which is configured to receive the light 104 of the second spectral distribution. The second layer 106 comprises second luminescent material which is configured to absorb light 104 of the second spectral distribution and to convert the absorbed light towards light 102 of a third spectral distribution. The second layer 106 is configured to partially convert the received light 104 of the second spectral distribution to the light 102 of the third spectral distribution. Thus, the light emission of the light conversion assembly 100 comprises light 102 of the third spectral distribution and light 104 of the second spectral distribution. In an alternative embodiment, the second layer 106 is configured to fully convert the light 104 of the second spectral distribution to the light 102 of a third spectral distribution.

It is to be noted that in the description of the figures the material in the first layer 108 are quantum dots. Instead of quantum dots other materials may be used as well, such as quantum rods or quantum tetrapods. The luminescent material of the first layer 108 comprises at least particles showing quantum confinement and have at least in one dimension a size in the nanometer range. This means, for example, that, if the particles are substantially spherical, their diameter is in the nanometer range. Or, this means, for example, if they are wire-shaped, that a size of a cross-section of the wire is in one direction in the nanometer range. A size in the nanometer range means that their size is at least smaller than 1 micrometer, thus, smaller than 1000 nanometer, and larger or equal to 0.5 nanometer. In an embodiment, the size in one dimension is smaller than 50 nanometer. In another embodiment the size in one dimension is in the range from 2 to 30 nanometer.

It is noted that the first layer 108 and the second layer 106 are not arranged on top of each other, but that a gap is present between the two layers. In other embodiments, the two layers 106, 108 are arranged on top of each other.

Figure 1B:
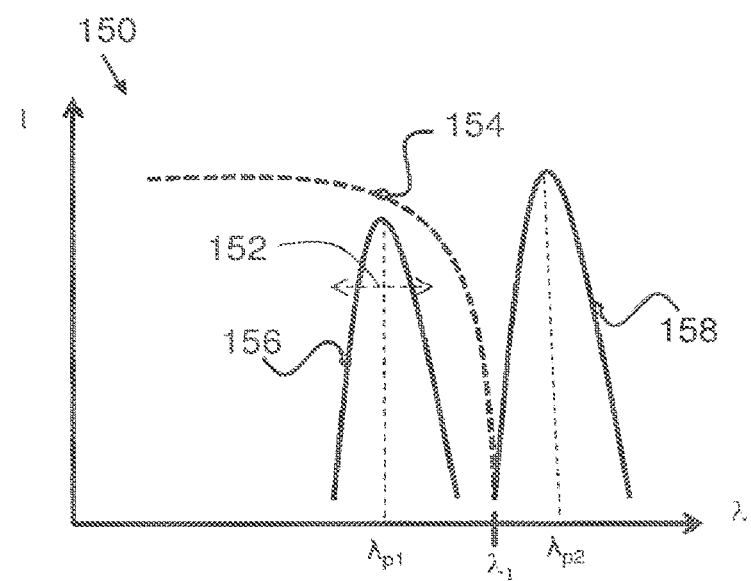

FIG. 1b shows a chart 150 with light emission spectra and light absorption spectra of the light source and first layer of the light conversion assembly. The light which is received by the first layer 108 from a light source is light emission spectrum 156 which has a first peak wavelength $\lambda p1$. The light emission spectrum 156 is in the violet or blue spectral range and, consequently, the first peak wavelength $\lambda p1$ is within one of these ranges. The quantum dots of the first layer 108 have a light absorption spectrum 154 which overlaps with the violet spectral range and partly with the blue spectral range. The light absorption spectrum 154 is relatively flat and has a strong cut-off wavelength $\lambda 1$. Substantially all light of the first light emission spectrum 156 is being absorbed by the quantum dots. Even if the first light emission spectrum 156 is located slightly more towards shorter wavelengths, or slighted more towards longer wavelengths (as indicated with arrow 152), the first light emission spectrum 156 is still within the light absorption spectrum 154 of the quantum dots. Thus, independently of the location of the first light emission spectrum 156 within the light absorption spectrum 154 of the quantum dots, the light of the first light emission spectrum 156 is absorbed. If there is enough quantum dot material in the first layer 108, substantially all light 110 of the first spectral distribution is absorbed. The quantum dot material converts the absorbed light towards light of the second spectral distribution. The second spectral range is drawn in FIG. 1b as the second light emission distribution 158 which is arranged in the blue spectral range and which has a second peak wavelength $\lambda p2$ that is a longer wavelength that the first peak wavelength $\lambda p1$. The position of the second light emission distribution 158 is not variable, even not if the light of the first spectral distribution is located at another position in the absorption spectrum 154 of the quantum dots.

Thus, the first layer 108 of the light conversion assembly 100 contributes to the effect that the second layer 106, which comprises the second luminescent material, always receives light 104 of the same second spectral distribution even if the location of the first spectral distribution differs as the result of the use of different light sources. Thus, if a specific ratio of light 104 of the second spectral distribution and light 102 of the first spectral distribution must be emitted, the light conversion assembly 100 can always be constructed by using the same type of second layer 106. There is no need to use different types of second layers 106, which have different thicknesses or different concentrations of the second luminescent material, to generated light with the specific ratio of light 102, 104 of the second and third spectral distribution.

According to an embodiment of the invention, first peak wavelength $\lambda p1$ is in the violet spectral range, e.g. in the range from 380 nanometers to 440 nanometers. In another embodiment, the first peak wavelength $\lambda p1$ is in the lower blue spectral range, e.g. in the range from 440 nanometers to 460 nanometers. According to an embodiment of the invention, the second peak wavelength is in the higher blue spectral range, e.g. in the range from 460 nanometers to 480 nanometers. In a further embodiment of the invention, the light of the third spectral distribution falls within a spectrum from 500 nanometers to 800 nanometers.

Figure 2A:
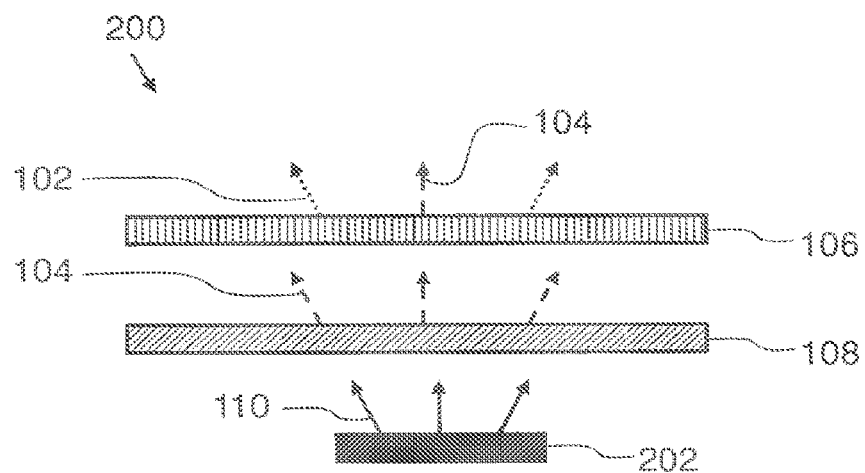

FIG. 2a schematically shows another embodiment of the light conversion assembly 200 in a cross-sectional view. In addition to the light conversion assembly 100 of FIG. 1a, the light conversion assembly 200 of FIG. 2a comprises a light source 202 which emits the light 110 of the first spectral distribution. Any suitable light source for emitting light in the violet or blue spectral range may be used. Examples are: a Light Emitting Diode (LED), or a laser diode. It is to be noted that the light source 202 is not in direct contact with the first layer 108. In other words, a gap is present between the light source 202 and the first layer 108. In other embodiments, the first layer 108 may be arranged directly on top of the light source 202.

Figure 2B:
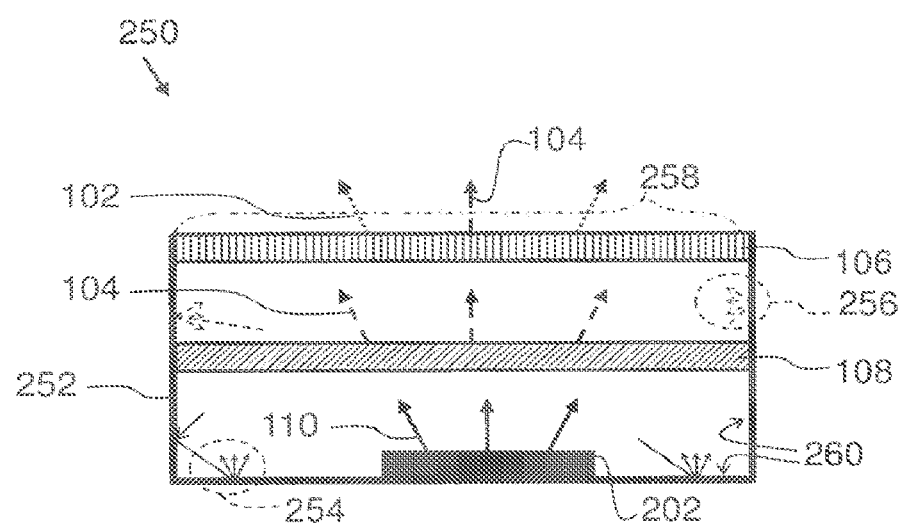

FIG. 2b schematically shows a further embodiment of the light conversion assembly 250 in a cross-sectional view. The light conversion assembly 250 is similar to the light conversion assembly 200 of FIG. 2a with one important difference: a reflective light mixing chamber 252 is added to the light conversion assembly 250. In the embodiment of FIG. 2b the light source 202 and the first layer 108 are provided within the reflective light mixing chamber 252, and the second layer 106 is provided at a light exit window 258 of the reflective light mixing chamber 252. At least the inner walls 160 of the reflective light mixing chamber 252 are reflective, and in an embodiment diffusely reflective. In FIG. 2b is schematically indicated, for example at locations 254, 256 that light, which impinges on the inner walls 260, is diffusely reflected. At location 254 light of the first spectral distribution may impinge on the reflective inner walls 260. At location 256 light of the second spectral distribution may impinge on the reflective walls. The reflected light is recycled such that it can still reach the first layer 108 or the second layer 106 for being converted to another color. Optionally, the inner walls 260 have a reflectivity which is higher than 90%, and in another embodiment the reflectivity of the inner walls 260 is larger than 95%.

Optionally, the light conversion assembly 250 may comprises optical bridging elements (not shown) which are arranged in optical contact with the light source 202, with the first layer 108 and/or the second layer 106. An optical bridging element may increase the transport of light from the light source 202 towards the first layer 108 and/or towards the second layer 106 and may increase the outcoupling of light from the light source 202. Suitable materials for the optical bridging element may be glass, quartz or thermal stable polymer such as silicones. Typically the refractive index of the optical bridging member is in the range from 1.2 to 1.8. Polydimethylsiloxane (PDMS) has, for example, a refractive index of 1.4.

Figure 3:
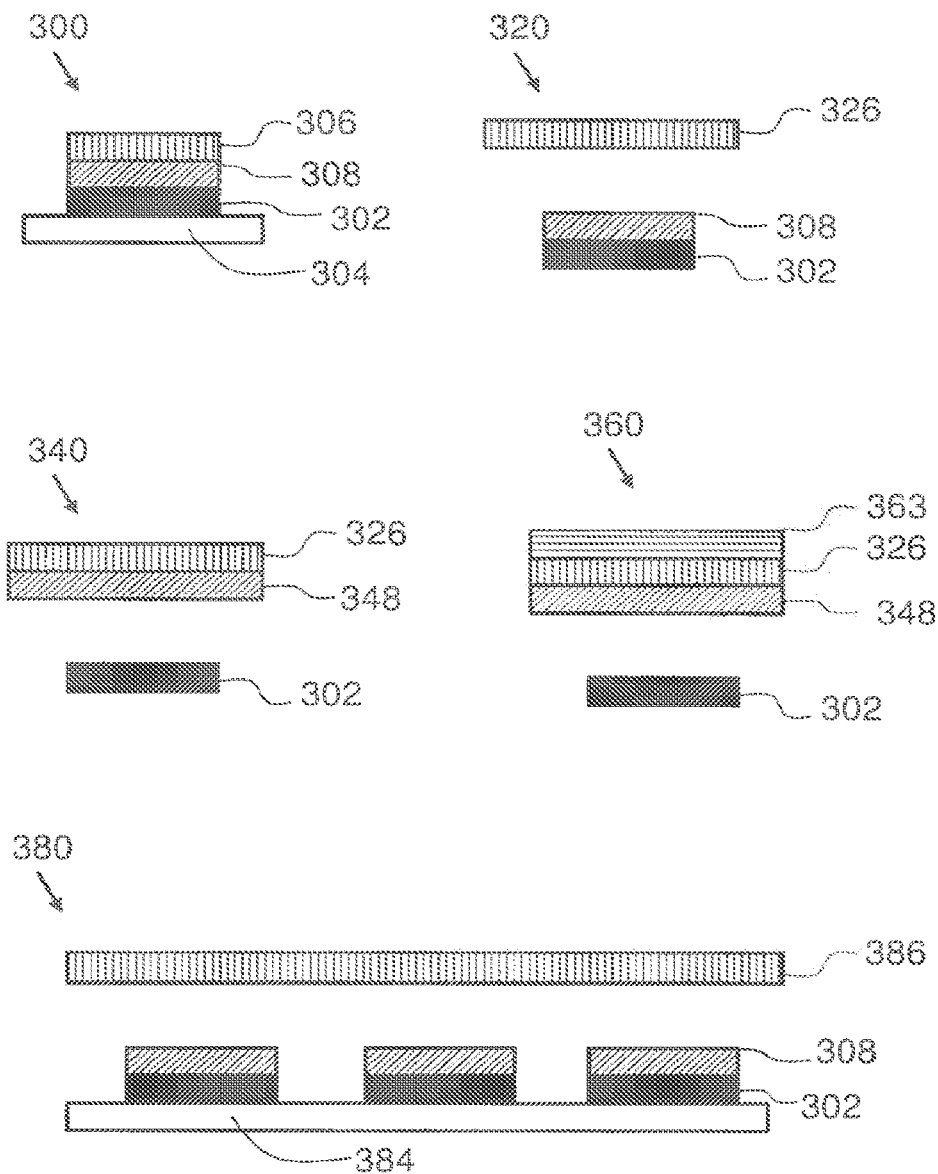

FIG. 3 schematically shows alternative arrangements of the components of the light conversion assembly in a cross-sectional view. In light conversion element 300, a light source 302, which emits light in a first spectral distribution, is arranged on a support layer 304. The light source 302 is configured to emit the light of the first spectral distribution in the violet or blue spectral range. On top of the light source 302 is arranged a first layer 308 which comprises quantum dots. The first layer 308 is configured such that all light of the first spectral distribution is converted towards light of a second spectral distribution. The second spectral distribution is within the blue spectral range. On top of the first layer 308 is arranged a second layer 306 which comprises a second luminescent material which is configured to convert a portion of the light of the second spectral distribution towards light of a third spectral distribution.

The light conversion assembly 320 is similar to light conversion assembly 300. The light source 302 is not arranged on a support layer 304, however, in other embodiments of the light conversion assembly 320, the light source 302 may be arranged on a support layer 304. The first layer 308 is arranged on the light source 302. A second layer 326, which has a large area than the second layer 306, is arranged at a distance away from the combination of the light source 302 and the first layer 308. In other words, a gap is present between the second layer 326 and the other components of the light conversion assembly 320.

The light conversion assembly 340 is similar to the light conversion assembly 320, however, the first layer 348 is not arranged on top of the light source 302, but is in direct contact with the second layer 326. A gap is present between the light source 302 and the first layer 348.

The light conversion assembly 360 is similar to the light conversion assembly 340, however, an additional third layer 363 is provided on top of the second layer 326. The third layer 363 comprises a third luminescent material which converts a portion of the light of the second spectral distribution, or a portion of the light of the third spectral distribution, towards light of a fourth spectral distribution. As the result of the third luminescent material, the light emission of the light conversion assembly 360 comprises a third color of light, which is the light of the fourth spectral distribution. Thus, more different colors can be generated or white light with a higher Color Rendering Index can be obtained. In the color conversion assembly 360 of FIG. 3, the second luminescent material and the third luminescent material are arranged in different layers. In other embodiments they may be arranged as a mix in a single layer, or they may be arranged in a single layer wherein the different luminescent materials are separated in space in the single layer. Even more than two luminescent materials may be used in order to generate even more colors of light or white light of a higher quality.

Light conversion assembly 380 is another alternative arrangement. A plurality of combinations of light sources 302 with the first layer 308 on top of the light sources 302 are arranged on a support layer 384. A single second layer 386 with the second luminescent material is arranged at a short distance away from the first layers 308. In an alternative arrangement the first layers 308 are not arranged directly on top of the light sources 302, but are arranged at a short distance away from the light sources 302, or they are combined into a single layer which is, for example, in direct contact with the second layer 386.

It is noted that the skilled person is able to combine all kind of arrangements of the FIGS. 1a, 1b, 2a, 2b and 3 in order to obtain a light conversion assembly which best suits his requirements.

In embodiments of the invention quantum dots may be used as the first luminescent material of the first layer. Quantum dots are small crystals of semiconducting material generally have a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with shell such as cadmium sulfide (CdS) and zinc sulfide (ZnS). Cadmium free quantum dots such as indium phosphode (InP), and copper indium sulfide (CuInS2) and/or silver indium sulfide (AgInS2) can also be used. Quantum dots show very narrow emission band and thus they show saturated colors. Furthermore the emission color can easily be tuned by adapting the size of the quantum dots. Any type of quantum dot known in the art may be used in the present invention, provided that it has the appropriate wavelength conversion characteristics.

In embodiments of the invention the second layer comprises a second luminescent material. The second luminescent material may be an organic or an inorganic material. Examples of organic luminescent materials suitable for use as the wavelength converting material include luminescent materials based on Perylene derivatives, which are, for example, sold under the brand name Lumogen. Examples of suitable commercially available products thus include, but are not limited to, Lumogen Red F305, Lumogen Orange F240, Lumogen Yellow F170, Lumogen F083 and combinations thereof.

Examples of inorganic luminescent material, e.g. phosphors, suitable for the second layer include, but are not limited to, cerium doped yttrium aluminum garnet ($Y_3Al_5O_{12}:Ce^{3+}$, also referred to as YAG:Ce or Ce doped YAG) or lutetium aluminum garnet (LuAG, $Lu_3Al_5O_{12}$), α-SiAlON:Eu2+(yellow), and M2Si5N8:Eu2+(red) wherein M is at least one element selected from calcium Ca, Sr and Ba. Another example of an inorganic phosphor that may be used in embodiments of the invention, typically when the received ligt is blue light, is YAG:Ce. Furthermore, a part of the aluminum may be substituted with gadolinium (Gd) or gallium (Ga), wherein more Gd results in a red shift of the yellow emission. Other suitable materials may include (Sr1-x-yBaxCay)2-zSi5-aAlaN8-aOa:Eu2+ wherein $0 \le a < 5$, $0 \le x \le 1$, $0 \le y \le 1$ and $0 < z \le 1$, and $(x+y) \le 1$, such as Sr2Si5N8:Eu2+ which emits light in the red range.

Optionally the second layer comprises scattering elements, e.g. particles of Al2O3, BaSO4 or TiO2.

Figure 4A:
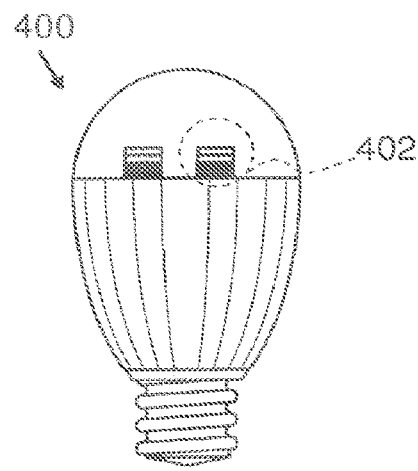
Figure 4B:
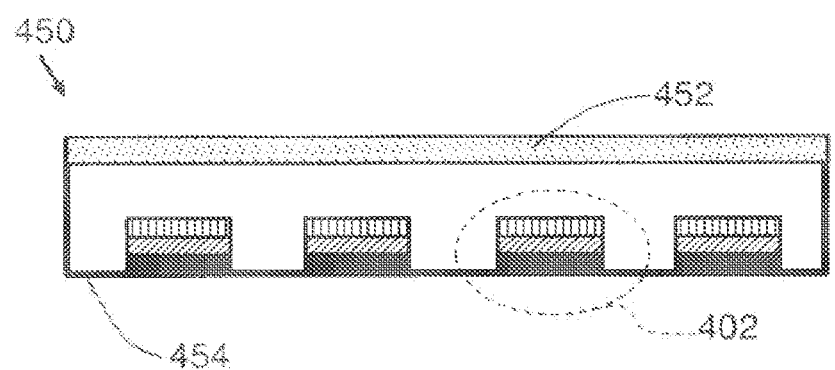

FIGS. 4a and 4b schematically show embodiments of a lamp 400, 450 according to the second aspect of the invention. The lamp 400 is a retrofit light bulb in which a plurality of light conversion assemblies 402 according to the first aspect of the invention are arranged. The lamp 450 is a so-termed light engine which comprises a light-mixing box 454 of which the inner walls are light reflective and which comprises at its light exit window a diffuser 452. Opposite the diffuser, a plurality of light conversion assemblies are arranged inside the light mixing box 454 which emit light towards the light exit window of the light mixing box 454. Light, which is not directly transmitted into the ambient through the diffuser 452 and which is back reflected, is recycled by the reflective inner walls of the light mixing box 454. The disclosed light conversion assemblies can be used in any lamp including, but not limited to, an incandescent replacement lamp, a TL replacement lamp, a halogen replacement lamp.

Figure 5:
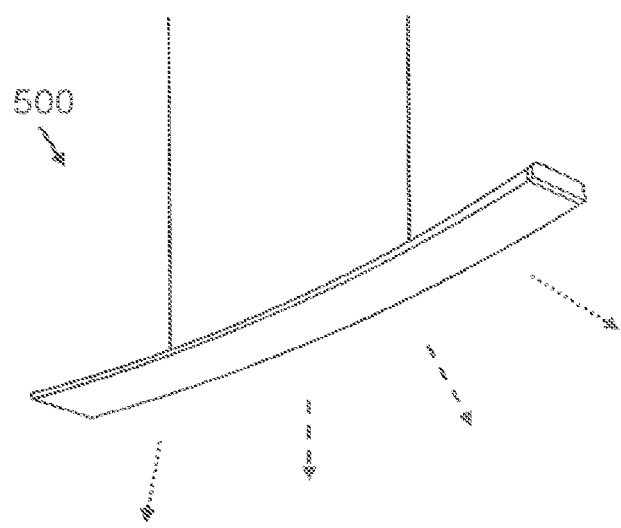

FIG. 5 schematically shows an embodiment of a luminaire 500 according to the third aspect of the invention. The luminaire 500 comprises one or more light conversion assemblies (not shown) according to the first aspect of the invention, or comprises one or more lamps (not shown) according to the second aspect of the invention.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A device comprising:
   a light source for emitting first light of a first spectral distribution in a violet or blue spectral range;
   a first luminescent material comprising particles showing quantum confinement and having at least in one dimension a size in the nanometer range, the first luminescent material being disposed to receive the first light, the first luminescent material being configured to absorb substantially all the received first light, the first luminescent material emitting second light of a second spectral distribution in the blue spectral range, independently of the position of first spectral distribution in the violet or blue spectral range;
   a second luminescent material, the second luminescent material being arranged to receive second light and being configured to at least partially convert the received second light into third light of a third spectral distribution being different from the first spectral distribution and the second spectral distribution; and
   a third luminescent material, the third luminescent material being arranged to receive second and/or third light and being configured to at least partially convert the received second and/or third light into fourth light of a fourth spectral distribution being different from the first, second, and third spectral distributions.

2. The device of claim 1 wherein a peak wavelength of the second spectral distribution is longer than a peak wavelength of the first spectral distribution.

3. The device of claim 1 wherein the second luminescent material and third luminescent material are arranged in different layers.

4. The device of claim 1 wherein the second luminescent material and third luminescent material are mixed in a single layer.

5. The device of claim 1 wherein the second luminescent material and third luminescent material are arranged in a single layer wherein the second and third luminescent materials are separated in space in the single layer.

6. The device of claim 1 wherein the second luminescent material is arranged on the first luminescent material, the third luminescent material is arranged on the second luminescent material, and the first luminescent material is spaced apart from the light source.

7. The device of claim 1 wherein the first luminescent material comprises one of CdS, CdSe, ZnS, InP, $CuInS_2$, and $AgInS_2$.

8. A device comprising:
   a light source for emitting first light of a first spectral distribution in a violet or blue spectral range;
   a first luminescent material comprising particles showing quantum confinement and having at least in one dimension a size in the nanometer range, the first luminescent material being disposed to receive the first light, the first luminescent material being configured to absorb substantially all the received first light, the first luminescent material emitting second light of a second spectral distribution in the blue spectral range, independently of the position of first spectral distribution in the violet or blue spectral range;
   a second luminescent material, the second luminescent material being arranged to receive second light and being configured to at least partially convert the received second light into third light of a third spectral distribution being different from the first spectral distribution and the second spectral distribution; and
   a gap disposed between the light source and the first luminescent material.

9. The device of claim 8, wherein a gap is present between the first luminescent material and the second luminescent material.

10. The device of claim 8, further comprising an optical bridging element in optical contact with the light source and the first luminescent material.

11. The device of claim 10 wherein the optical bridging element is one of glass, quartz, thermally stable polymer, silicone, and polydimethylsiloxane.

12. The device of claim 8 further comprising a reflective light mixing chamber, wherein at least one of the light source, the first luminescent material, and the second luminescent material are arranged within the reflective light mixing chamber, wherein the reflective light mixing chamber comprises reflective sidewalls.

13. The device of claim 12, wherein the reflective light mixing chamber comprises a light exit window and the second luminescent material is arranged at the light exit window.

14. The device of claim 8 wherein the first luminescent material comprises at least one of quantum dots, quantum rods and quantum tetrapods.

15. The device of claim 8 further comprising a scattering material disposed with the second luminescent material.

16. The device of claim 15 wherein the scattering material comprises one of $Al_2O_3$, $BaSO_4$, and $TiO_2$.

17. A device comprising:
   a light source for emitting first light of a first spectral distribution in a violet or blue spectral range;
   a first luminescent material comprising particles showing quantum confinement and having at least in one dimension a size in the nanometer range, the first luminescent material being disposed to receive the first light, the first luminescent material being configured to absorb substantially all the received first light, the first luminescent material emitting second light of a second spectral distribution in the blue spectral range, independently of the position of first spectral distribution in the violet or blue spectral range.

18. The device of claim 17, wherein an absorption spectrum of the first luminescent material fully overlaps with the first spectral distribution.

19. The device of claim 17, wherein a quantity of first luminescent material is large enough to fully absorb the received first light.

\* \* \* \* \*